United States Patent
Tabata

(10) Patent No.: US 9,237,673 B2
(45) Date of Patent: Jan. 12, 2016

(54) HOLDING MECHANISM FOR A DISPLAY DEVICE

(71) Applicant: SHARP KABUSHIKI KAISHA, Osaka-shi, Osaka (JP)

(72) Inventor: Shinji Tabata, Osaka (JP)

(73) Assignee: SHARP KABUSHIKI KAISHA, Osaka (JP)

( * ) Notice: Subject to any disclaimer, the term of this patent is extended or adjusted under 35 U.S.C. 154(b) by 0 days.

(21) Appl. No.: 14/286,302

(22) Filed: May 23, 2014

(65) Prior Publication Data

US 2014/0346292 A1  Nov. 27, 2014

(30) Foreign Application Priority Data

May 27, 2013 (JP) .................. 2013-111027

(51) Int. Cl.
*F16M 11/38* (2006.01)
*H05K 7/18* (2006.01)
*F16M 11/10* (2006.01)

(52) U.S. Cl.
CPC . *H05K 7/18* (2013.01); *F16M 11/10* (2013.01)

(58) Field of Classification Search
CPC ... F16M 11/04; F16M 11/10; F16M 11/2092; F16M 200/063
USPC ........................................................ 248/920
See application file for complete search history.

(56) References Cited

U.S. PATENT DOCUMENTS

| | | | |
|---|---|---|---|
| 4,491,979 A | 1/1985 | Ogasawara et al. | |
| 4,836,478 A * | 6/1989 | Sweere | 248/279.1 |
| 5,108,063 A * | 4/1992 | Koerber et al. | 248/284.1 |
| 5,501,420 A * | 3/1996 | Watt et al. | 248/280.11 |
| 5,738,316 A * | 4/1998 | Sweere et al. | 248/123.11 |
| 6,012,693 A * | 1/2000 | Voeller et al. | 248/280.11 |
| 7,726,616 B2 * | 6/2010 | Zhang et al. | 248/284.1 |
| 7,789,363 B2 * | 9/2010 | Duan | 248/284.1 |
| 8,011,632 B2 * | 9/2011 | Wang et al. | 248/284.1 |
| 8,070,115 B2 * | 12/2011 | Wang et al. | 248/157 |
| 8,864,092 B2 * | 10/2014 | Newville | 248/317 |
| 8,937,815 B2 * | 1/2015 | De Jong et al. | 361/809 |
| 8,967,569 B2 * | 3/2015 | Hsu | 248/284.1 |
| 2004/0021051 A1 * | 2/2004 | Chiu | 248/371 |
| 2005/0051688 A1 * | 3/2005 | Dittmer | 248/276.1 |
| 2007/0001076 A1 * | 1/2007 | Asamarai et al. | 248/281.11 |

(Continued)

FOREIGN PATENT DOCUMENTS

CN  201636510 U  11/2010
CN  103363270 A  10/2013

(Continued)

*Primary Examiner* — Bradley Duckworth

(74) *Attorney, Agent, or Firm* — Birch, Stewart, Kolasch & Birch, LLP

(57) ABSTRACT

A holding mechanism of a display device includes a first arm, a second arm and a damper. The first arm and the second arm hold the display device in such a manner that the display device is capable of being displaced between a first disposition in which a lower edge portion of the display device is away from a placing face with a display screen facing to a front and a second disposition in which the lower edge portion is in contact with the placing face with the display screen facing more upward than in the first disposition. The damper applies, to the first arm, a force that buffers a force by which the display device is liable to displacement from the first disposition to the second disposition due to self-weight.

4 Claims, 9 Drawing Sheets

(56) References Cited

U.S. PATENT DOCUMENTS

| | | | |
|---|---|---|---|
| 2007/0259554 A1* | 11/2007 | Lindblad et al. | 439/354 |
| 2009/0166501 A1* | 7/2009 | Wang et al. | 248/419 |
| 2011/0260017 A1* | 10/2011 | Monsalve et al. | 248/201 |
| 2012/0033371 A1* | 2/2012 | Pankros et al. | 361/679.21 |
| 2012/0037785 A1* | 2/2012 | Xu et al. | 248/571 |
| 2012/0138754 A1* | 6/2012 | Lim | 248/74.1 |
| 2012/0182709 A1 | 7/2012 | Asai et al. | |
| 2013/0037670 A1* | 2/2013 | Lu et al. | 248/284.1 |
| 2013/0284871 A1* | 10/2013 | Huang | 248/282.1 |
| 2013/0327911 A1* | 12/2013 | Russell | 248/276.1 |

FOREIGN PATENT DOCUMENTS

| | | |
|---|---|---|
| GB | 2 112 279 A | 7/1983 |
| JP | 58-188972 | 11/1983 |
| JP | 2001-50245 A | 2/2001 |
| JP | 2001-203473 A | 7/2001 |
| JP | 2005-164841 A | 6/2005 |
| JP | 2012-151299 A | 8/2012 |

* cited by examiner

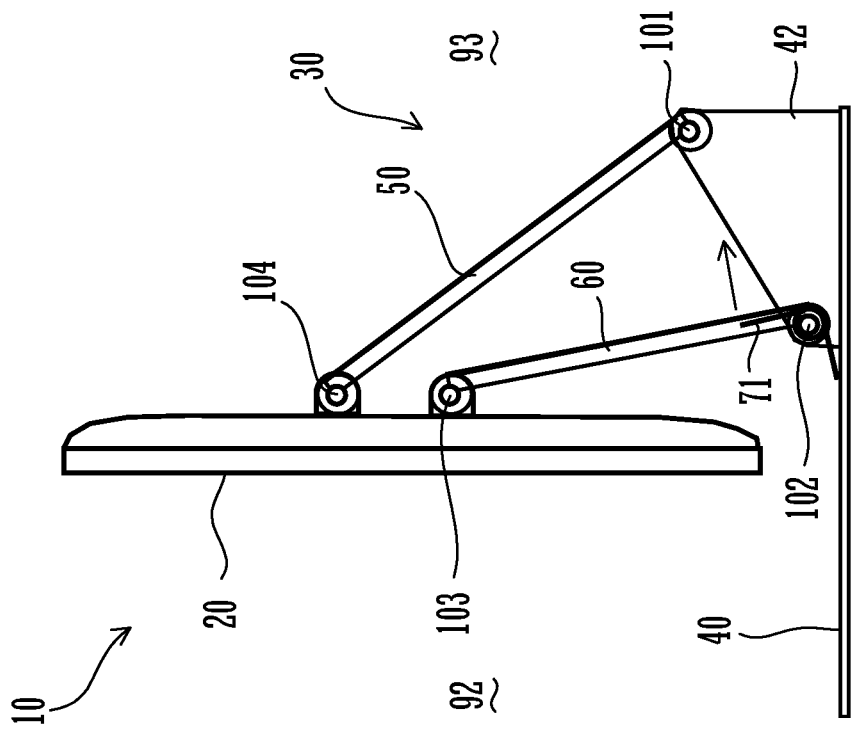
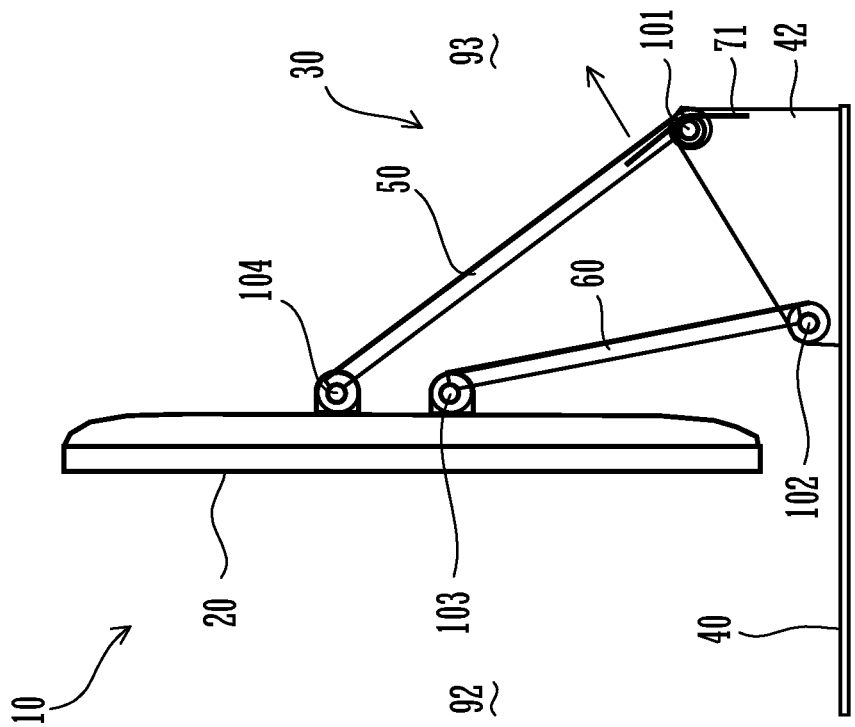

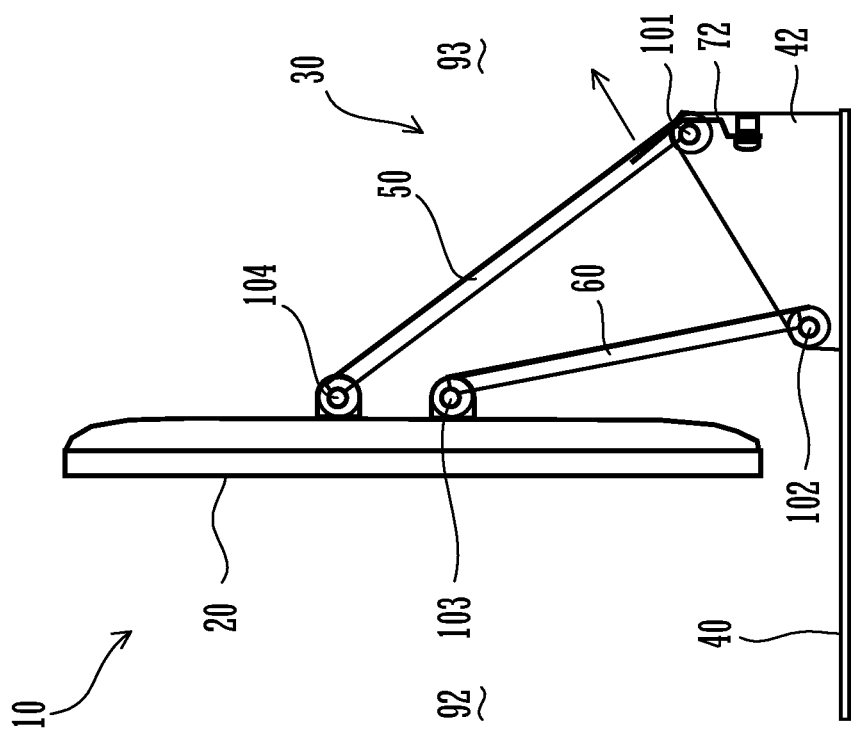

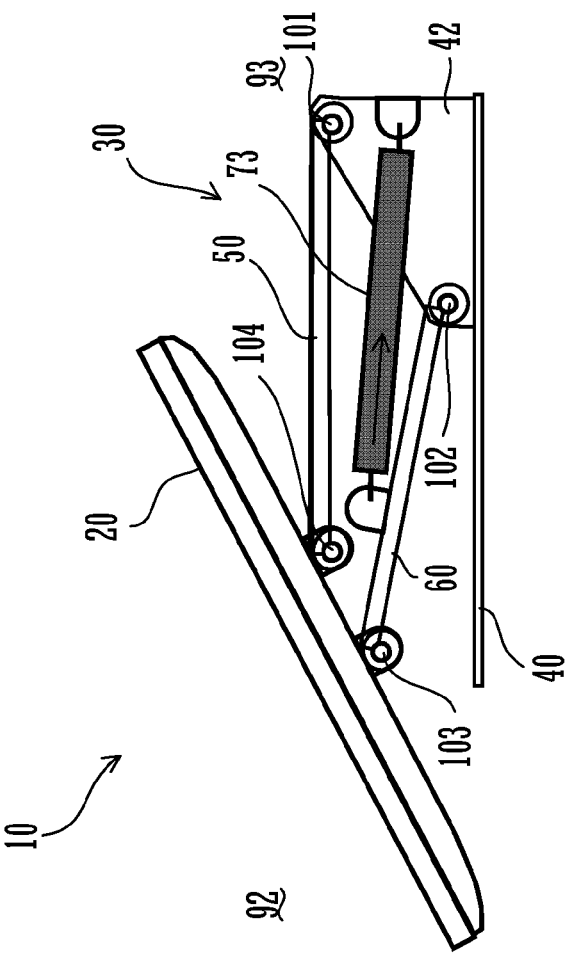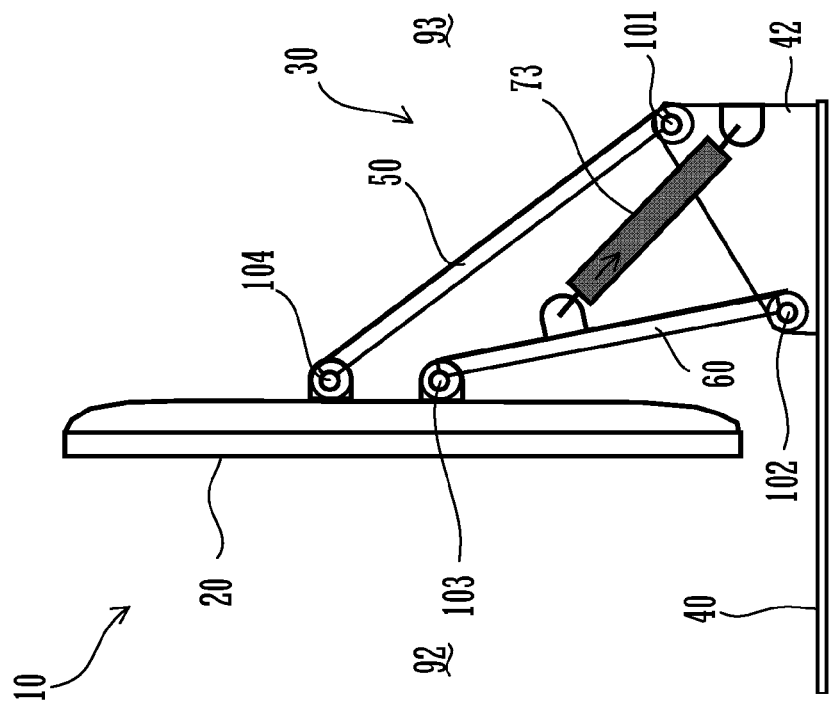

HOLDING MECHANISM FOR A DISPLAY DEVICE

CROSS REFERENCE

This Nonprovisional application claims priority under 35 U.S.C. §119(a) on Patent Application No. 2013-111027 filed in Japan on May 27, 2013, the entire contents of which are hereby incorporated by reference.

BACKGROUND OF THE INVENTION

The present invention relates to a holding mechanism for a display device configured in such a manner that inputting operations can be made with information that is displayed.

Among the information processing units such as tablet type PC (personal computer), desktop PC of recent years and the like are ones allowing a user to perform inputting operations such as cursor moving, file manipulating, page flipping and so forth through a touching operation and/or a motioning operation with a user's finger on an input section such as touch panel or the like that is provided on a display device, as well as allowing the user to perform inputting operations with a key-board and/or a mouse.

With an information processing unit provided with such a display device that is configured in such a manner as to allow the inputting operations as above-mentioned, space-saving can be achieved by disposing the display device upright in generally vertical direction when the display device is not in use, or when a display screen is just viewed without the inputting operations such as touching operation and/or the like being carried out on the display device. On the other hand, operability is improved by disposing the display device in an upward leaning direction or in generally horizontal direction when the inputting operation such as touching operation or the like is carried out on the display device.

Also, display devices have upsized with price reduction, and have thereby increased their weight.

Then, an information processing unit has became known (for example, refer to Japanese Patent Unexamined Publication No. 2001-203473 bulletin) that includes a display device having an input section, a housing section and a holding mechanism, in which the holding mechanism is configured using a stay, an air damper and a plurality of free stop hinges each having a hinging assembly, and in which the display device is configured in such a manner as to be capable of being swung between a position above the housing and a position that is in front of the housing and lower than a user's sight line.

However, in the information processing unit having the conventional holding mechanism for the display device, because a lower edge portion of the display device is away from a placing face on which the information processing unit is placed in a disposition in which the display device is disposed in front of the housing, the display device wobbles when an inputting operation such as touching operation or the like is carried out on the display device; so that there is a risk that operability of the display device reduces.

The present invention is directed to providing a holding mechanism for a display device that is capable of improving operability of the display device configured in such a manner as to allow inputting operations.

SUMMARY OF THE INVENTION

A holding mechanism for a display device of the present invention is a holding mechanism for a display device configured in such a manner that inputting operations can be made with information that is displayed. The holding mechanism for the display device includes a base, a first arm, a second arm and a buffering member. The base is placed on a placing face for the display device. The first arm and the second arm are supported via shafts at one respective ends by mutually distinct portions of the display device, are supported via shafts at the other respective ends by mutually distinct portions of the base more to a back than the display device, and do not intersect with each other in side view. The first arm and the second arm hold the display device in such a manner that the display device is capable of being displaced between a first disposition in which a lower edge portion of the display device is away from the placing face with a display screen facing to a front and a second disposition in which the lower edge portion is in contact with the placing face with the display screen facing more upward than in the first disposition. The buffering member applies, to at least either one of the first arm and the second arm, a force that buffers a force by which the display device is liable to displacement from the first disposition to the second disposition due to self-weight.

With the configuration, a rate of displacement of the display device from the first disposition to the second disposition due to self-weight is reduced by the buffering member; so that a rapid displacement of the display device is prevented. Therefore, the display device is prevented from being damaged. Further, because the lower edge portion of the display device is in contact with the placing face in the second disposition, wobbling of the display device is prevented even when an inputting operation such as touching operation and/or the like is carried out on the display device. Therefore, operability in inputting operations improves. Further still, because the lower edge portion of the display device is away from the placing face in the first disposition, a peripheral device such as key-board or the like, if any, can be used with a part of the peripheral device being disposed under the display device, thereby making it possible to effectively utilize space on the placing face.

The present invention makes it possible to improve operability of a display device configured in such a manner as to allow inputting operations.

BRIEF DESCRIPTION OF THE DRAWINGS

FIG. 7A is a side view showing a general configuration of a display unit provided with a holding mechanism for a display device according to a second embodiment; and FIG. 7B is a side view showing a general configuration of a display unit provided with a holding mechanism for a display device according to a third embodiment.

FIG. 8 is a side view showing a general configuration of a display unit provided with a holding mechanism for a display device according to a fourth embodiment.

FIG. 9A and FIG. 9B are side views showing a general configuration of a display unit provided with a holding mechanism for a display device according to a fifth embodiment, FIG. 9A showing a state in which the display device is disposed in the first disposition, FIG. 9B showing a state in which the display device is disposed in the second disposition.

DETAILED DESCRIPTION OF THE INVENTION

Figure 1C:
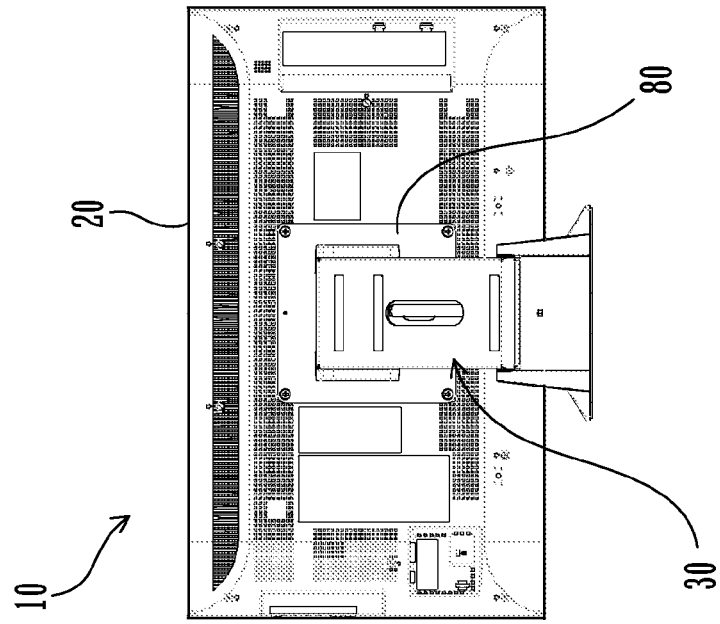
FIG. 1C is a rear view of the same.
Figure 1B:
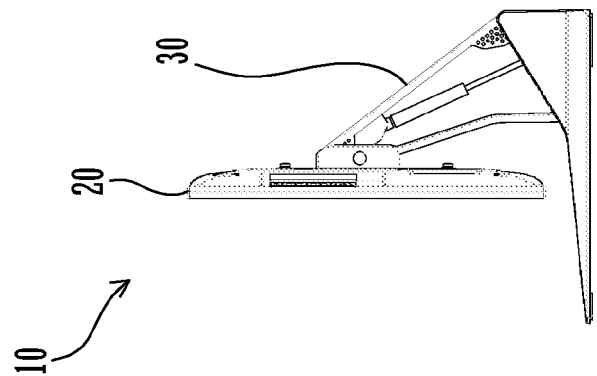
FIG. 1B is a side view of the same.
Figure 1A:
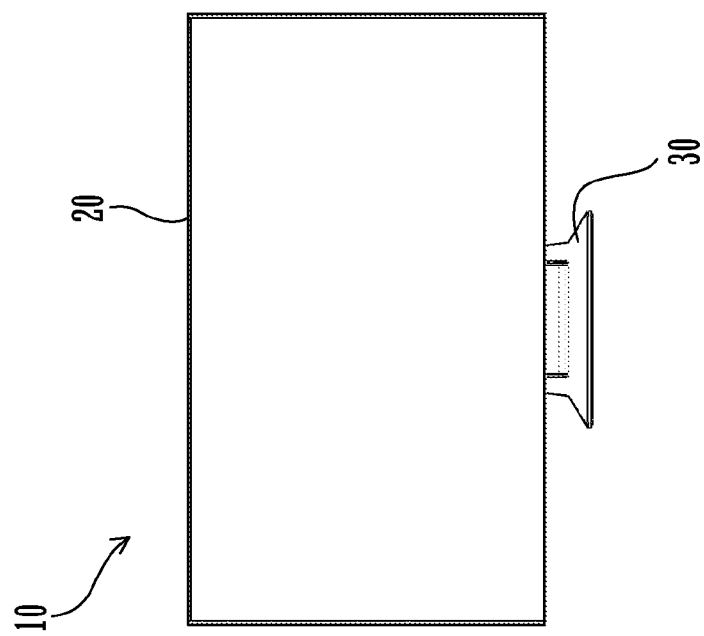
FIG. 1A is a front view of a display unit provided with a holding mechanism for a display device according to a first embodiment of the present invention.

As shown in FIGS. 1A through 1C, a display unit 10 includes a display device 20, and a holding mechanism 30 for the display device 20 according to a first embodiment of the present invention.

The display device 20 has a display section and an input section, and is configured in such a manner that inputting operations can be made with information that is displayed. As for an example of the display section, a LCD display or an organic EL display can be given. As for an example of the input section, a touch panel according to the capacitive sensing method or the electromagnetic induction method can be given.

As an example, the display device 20 is used as a display device for a desktop PC (personal computer). The display device 20 of the embodiment is 32-inch in size, and 9 kg in weight. The display device 20 is held by the holding mechanism 30. For example, the display unit 10 is placed on a desktop. Illustration of a PC main body to which the display device 20 is connected is omitted.

Figure 2:
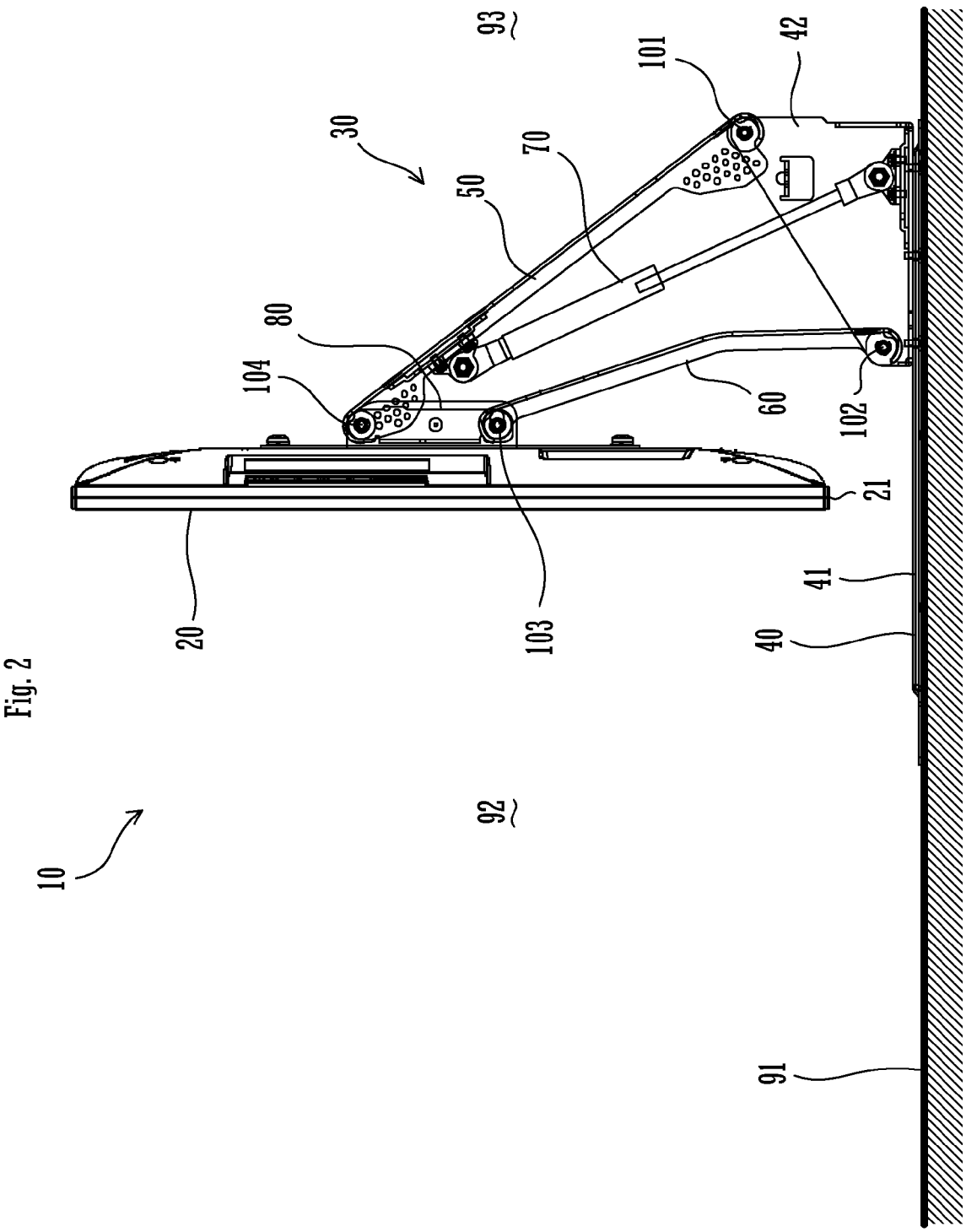
FIG. 2 is a side view of the display unit in a state in which the display device is disposed in a first disposition.

As shown in FIG. 2, the holding mechanism 30 includes a base 40, a first arm 50, a second arm 60, a damper 70 and a mounting plate 80. Additionally, in FIG. 2, and in later described FIG. 3, FIG. 4, FIG. 6A and FIG. 6B, opened-up states of parts of the holding mechanism 30 are shown for the convenience in giving explanations. The base 40 is placed on the placing face 91 such as desktop face. The base 40 includes a plate section 41 and a pair of upright sections 42. The plate section 41 is placed on the placing face 91. The upright sections 42 are installed vertically on the plate section 41 in such a manner as to face each other in the right and left direction. As an example, the upright sections 42 respectively have a triangle shape, and are disposed in such a manner that front 92 sides become higher than back 93 sides.

The mounting plate 80 is installed on a rear face of the display device 20. Details of the mounting plate 80 will be described later.

In the embodiment, the first arm 50 and the second arm 60 respectively have a plate-like shape with a width in the right and left direction.

The first arm 50 is supported via a shaft at one end in vertical direction by the mounting plate 80, and is supported via a shaft at the other end by the upright section 42.

The second arm 60 is disposed more to the front 92 side than the first arm 50. The second arm 60 is supported via a shaft at one end in vertical direction by the mounting plate 80 at a position different from the position supporting the first arm 50, and is supported via a shaft at the other end by the upright section 42.

A first shaft supporting section 101 between the first arm 50 and the upright section 42 is disposed more to the back 93 side and more upward than a second shaft supporting section 102 between the second arm 60 and the upright section 42. This makes it possible to shorten the first arm 50 as compared with a case where the first shaft supporting section 101 is disposed at the same height as the second shaft supporting section 102, thereby allowing a configuration of the display unit 10 at the back 93 to be downsized.

A third shaft supporting section 103 between the second arm 60 and the mounting plate 80 is disposed more to a side of the lower edge portion 21 of the display device 20 than a fourth shaft supporting section 104 between the first arm 50 and the mounting plate 80.

In this manner, the first arm 50 and the second arm 60 are disposed in such a manner as not to intersect with each other in side view.

Figure 4:
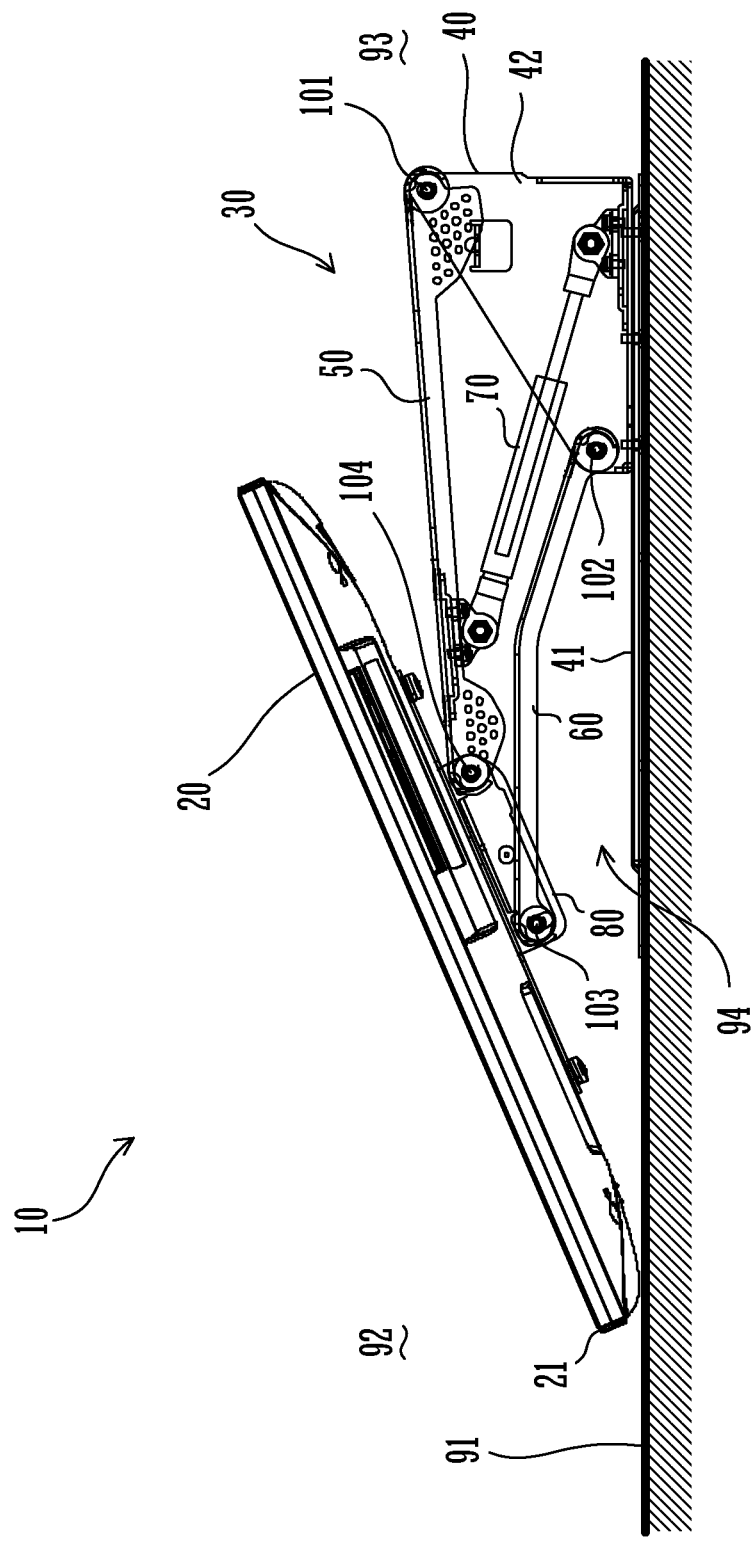
FIG. 4 is a side view of the display unit in a state in which the display device is disposed in the second disposition.

With the configuration as described above, the display device 20 is held by the first arm 50 and the second arm 60 in such a manner that the display device 20 is capable of being displaced between a first disposition in which a lower edge portion 21 of the display device 20 is away from the placing face 91 with a display screen facing to the front as shown in FIG. 2 and a second disposition in which the lower edge portion 21 is in contact with the placing face 91 with the display screen facing more upward than in the first disposition as shown in FIG. 4.

In the first disposition, the display device 20 is disposed in generally vertical direction; so that space-saving can be achieved. Further, because the lower edge portion 21 of the display device 20 is away from the placing face 91, a peripheral device such as key-board or the like, if any, can be used with a part of the peripheral device being disposed under the display device 20, thereby allowing effective utilization of space on the placing face.

Figure 3:
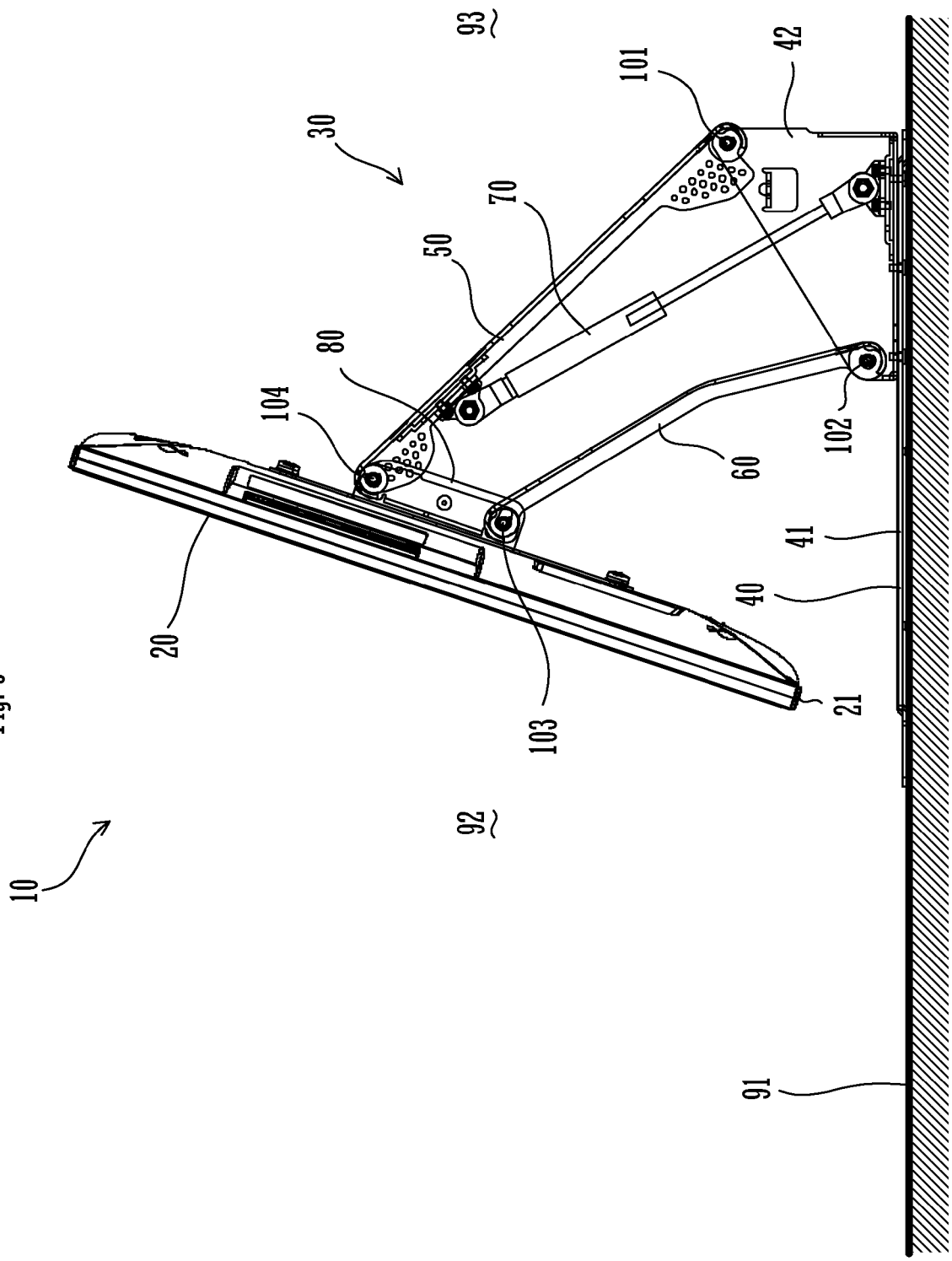
FIG. 3 is a side view of the display unit in a state in which the display device is in the course of being displaced between the first disposition and a second disposition.

As shown in FIG. 2 through FIG. 4, when being displaced from the first disposition to the second disposition, the display device 20 moves to the front 92 side while causing the display screen to rotate around the shafts, which extend in the right and left direction, toward a direction in which the display screen faces upward.

In the second disposition, a height of the display device 20 becomes lower than the height in the first disposition to an extent that it is lower than the height of a user's sight line; however, visibility of the display device 20 is still maintained high because of the display screen facing upward. Also, in the second disposition, the display device 20 is moved more to the front 92 side than in the first disposition, and therefore comes closer to the user's side; so that operability of the display device 20 improves.

Further, in the second disposition, because the lower edge portion 21 of the display device 20 is in contact with the placing face 91, wobbling of the display device 20 is prevented even when an inputting operation such as touching operation or the like is carried out on the display device 20. Thus, operability in inputting operations improves.

Further still, in the second disposition, because the lower edge portion 21 of the display device 20 is in contact with the placing face 91, the display unit 10 becomes more stable in the second disposition even when a weight of the base 40 which is a portion supporting the display device 20 is lightweight compared with a case where the display device 20 is not in contact with the placing face 91. Therefore, the display unit 10 can be placed on the desktop.

In the embodiment, the damper 70 is a gas damper. The damper 70 is supported via a shaft at one end in vertical direction by the first arm 50, and is supported via a shaft at the other end by the base 40 at a section more to the front 92 side than the first shaft supporting section 101. In the embodiment, the shaft supporting section between the damper 70 and the base 40 is located more to the front 92 side than the first shaft supporting section 101 and more to the back 93 side than the second shaft supporting section 102.

In a state in which the display device 20 is in the first disposition, the damper 70 applies, to the first arm 50, a force to hold the display device 20 in the first disposition.

The damper 70 is a buffering member applying, to the arm 50, a force that buffers a force by which the display device 20 is liable to displacement from the first disposition to the second disposition due to self-weight. Thus, a rate of displacement of the display device from the first disposition to the second disposition due to self-weight is reduced by the damper 70; so that a rapid displacement of the display device is prevented. Therefore, the display device 20 is prevented from being damaged.

In this manner, the display device 20 can be held in the first disposition; and after having been displaced gently to the second disposition with a small force, it can also be held in the second disposition.

Moreover, because the damper 70 applies, to the first arm 50, the force in a direction in which the display device 20 is displaced from the second disposition to the first disposition, a load to lift the display device 20 can be reduced when the display device 20 is displaced from the second disposition to the first disposition; and thus operability by a user in displacing the disposition of the display device 20 can be improved.

The second arm 60 bends toward a direction so as to be convex to the back 93 side. This can yield, as shown in FIG. 4, broadening of a space 94 between the second arm 60 and the placing face 91 in a state in which the display device 20 is disposed in the second disposition. Therefore, in the state in which the display device 20 is disposed in the second disposition, a peripheral device such as key-board or the like can be received under the display device 20.

Figure 5:
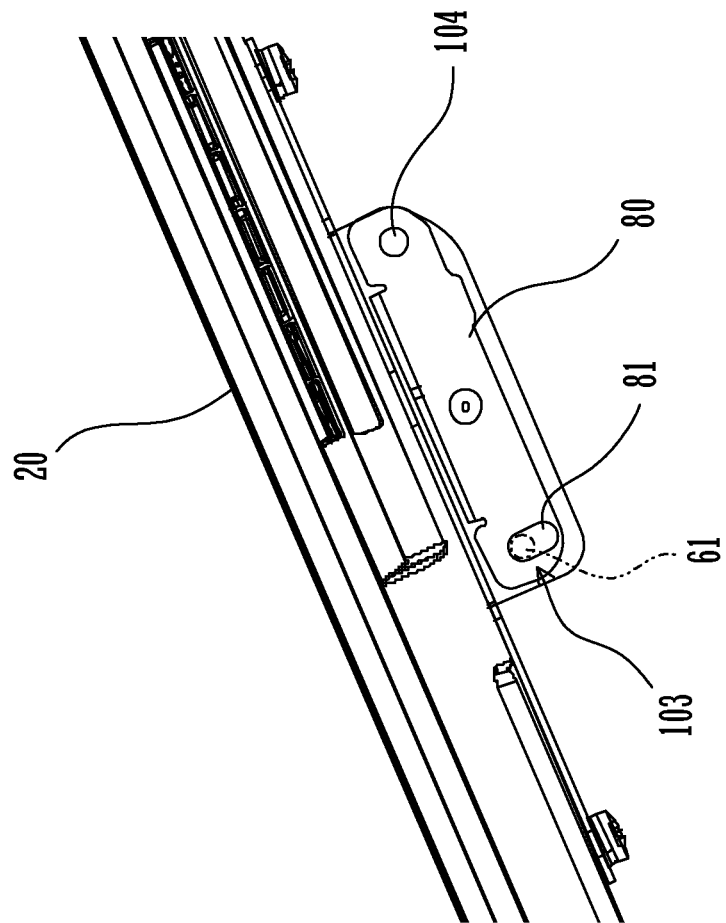
FIG. 5 is an enlarged view of a part of the holding mechanism for the display device.

Subsequently, the third shaft supporting section 103 between the second arm 60 and the mounting plate 80 is explained in detail. FIG. 5 shows an enlarged view of the mounting plate 80. The mounting plate 80 has a long hole 81 that is long in a direction not parallel with the display screen of the display device 20, that is to say, a direction intersecting the display screen. The second arm 60 has a protruded section 61. Being passed through the long hole 81, the protruded section 61 of the second arm 60 is movable in the longitudinal direction of the long hole 81, and rotatable in the long hole 81.

Figure 6A:
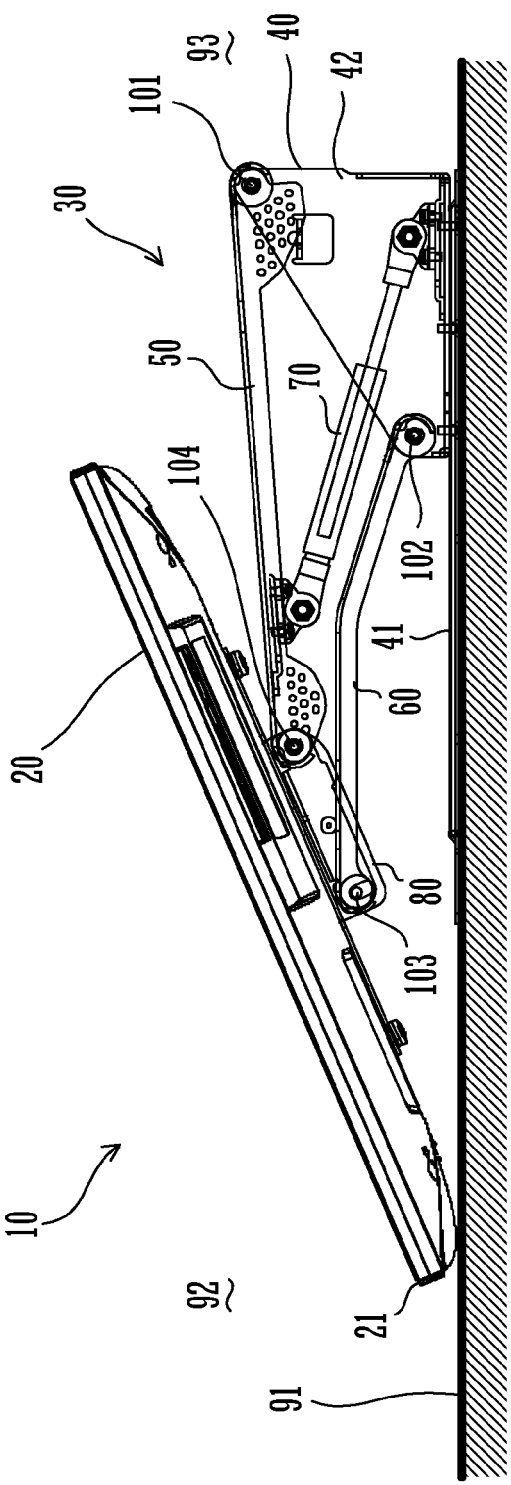
FIG. 6A is a side view of the display unit in a state in which a lower edge portion of the display device is in contact with a placing face in the second disposition.
Figure 6B:
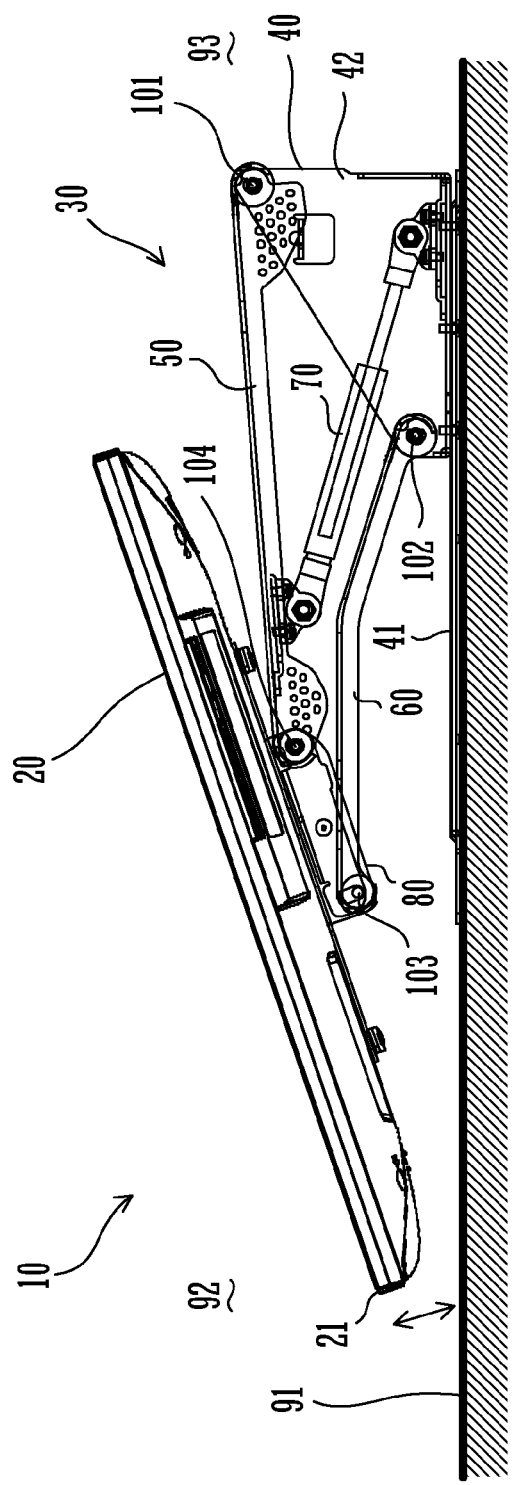
FIG. 6B is a side view of the display unit in a state in which the lower edge portion of the display device is away from the placing face in the second disposition.

This makes it possible, as shown in FIG. 6A and FIG. 6B, in the state in which the display device 20 is disposed in the second disposition, for the lower edge portion 21 of the display device 20 to be caused to swing upward and downward with the fourth shaft supporting section 104 between the first arm 50 and the mounting plate 80 functioning as a rotating shaft without causing the first arm 50 and the second arm 60 to be displaced.

Therefore, it is possible to prevent a user's finger from being caught between the lower edge portion 21 of the display device 20 and the placing face 91 when the user causes the display device 20 to be displaced from the first disposition to the second disposition. Also, even when the lower edge portion 21 of the display device 20 is in the state of being in contact with the placing face 91 as shown in FIG. 6A, the user's finger can be easily inserted under the lower edge portion 21 of the display device 20 by causing the lower edge portion 21 of the display device 20 to swing to bring to a state shown in FIG. 6B; so that operability in causing the display device 20 to be displaced from the second disposition to the first disposition can be improved.

As shown in FIG. 7A, for the buffering member, a spiral spring 71 can also be used instead of the damper 70. As an example, the spiral spring 71 is disposed at the first shaft supporting section 101. The spiral spring 71 applies, to the first arm 50, an urging force in a direction in which the display device 20 is caused to be displaced from the second disposition to the first disposition.

As shown in FIG. 7B, also, the spiral spring 71 can be disposed at the second shaft supporting section 102 this embodiment, the spiral spring 71 applies, to the second arm 60, an urging force in a direction in which the display device 20 is caused to be displaced from the second disposition to the first disposition.

Also, as shown in FIG. 8, for the buffering member, a plate spring 72 can be used. As an example, the spiral spring 71 is disposed at the first shaft supporting section 101; however, it can be dispose at the second shaft supporting section 102.

Further still, as shown in FIG. 9A and FIG. 9B, for the buffering member, also a coiled spring 73 can be used. As an example, one end of the coiled spring 73 is fastened to the second arm 60, and the other end is fastened to the base 40 at more to the back 93 side than the second shaft supporting section 102. The coiled spring 73 applies, to the second arm 60, an urging force to attract the second arm 60 toward the back 93.

Also with this configuration, not only the rate of displacement of the display device 20 from the first disposition to the second disposition due to self-weight is reduced by the coiled spring 73 and thereby the rapid displacement of the display device 20 can be prevented, but also the load to lift the display device 20 can be reduced when the display device 20 is caused to be displaced from the second disposition to the first disposition.

As described above, the buffering member is configured in such a manner as to apply, to at least either one of the first arm 50 and the second arm 60, the force that buffers the force by which the display device 20 is liable to displacement from the first disposition to the second disposition due to self-weight. Also, the buffering member can be configured in such a manner as to apply a force to the mounting plate 80.

Additionally, the third shaft supporting section 103 and the fourth shaft supporting section 104 are not limited to being located on the rear face of the display device 20, but can be provided on a side face of the display device 20.

In addition, in order to cause the lower edge portion 21 of the display device 20 to swing in the second disposition without causing the first arm 50 and the second arm 60 to be displaced, it is preferable that the buffering member is configured in such a manner as to apply the force to the first arm 50 rather than the second arm 60.

Moreover, the display device 20 is not limited to being a display device for a desktop PC (personal computer), but can be any display device that is configured in such a manner that inputting operations can be made with information that is displayed, and hence can be configured in a tablet type PC.

It is conceivable that new embodiments may be configured by combining respective technical features of the embodiments described above one another.

The above explanations of the embodiments are nothing more than illustrative in any respect, nor should be thought of as restrictive. Scope of the present invention is indicated by claims rather than the above embodiments. Further, it is intended that all changes that are equivalent to a claim in the sense and realm of the doctrine of equivalence be included within the scope of the present invention.

What is claimed is:

1. A holding mechanism operable to hold a display device so that inputting operations can be made on the display device, the holding mechanism comprising: a base; a first arm attached to the base via a first shaft supporting section; a second arm attached to the base via a second shaft supporting section; and a buffering member, wherein the second arm is attached to the display device via a third shaft supporting section; wherein the first arm is attached to the display device via a fourth shaft supporting section; wherein the first arm and second arm are operable to move between a first position, in which the display device is generally vertical and faces a front direction and a lower edge of the display device is positioned higher than a lower surface of the base, and a second position, in which the display device is caused to face more upward than in the first position and the lower edge of the display device and the lower surface of the base are positioned at a same height; wherein the first arm and the second arm do not intersect in side view and the second arm is disposed further towards the front direction than the first arm; wherein the buffering member applies, to at least either one of the first arm and the second arm, a force that buffers against a displacement of the display device from the first position to the second position; wherein the third shaft supporting section is supported via a shaft in a long hole that is long in a direction intersecting a display screen of the display device in the second position; and wherein the second arm has a protruded section, which is passed through the long hole and movable in the long hole in a longitudinal direction of the long hole.

2. The holding mechanism as claimed in claim 1, wherein the buffering member applies, to at least either one of the first arm and the second arm, a force to hold the display device in a state in which the display device is in the first position.

3. The holding mechanism as claimed in claim 1, wherein the first shaft supporting section is disposed more towards an upper part of the base than the second shaft supporting section.

4. The holding mechanism as claimed in claim 1, wherein the second arm has a convex shape facing towards a back of the base.

* * * * *